United States Patent

[11] 3,634,692

[72] Inventors Francois A. Padovani
Dallas;
George C. Sumner, Richardson, both of Tex.

[21] Appl. No. 742,323
[22] Filed July 3, 1968
[45] Patented Jan. 11, 1972
[73] Assignee Texas Instruments Incorporated
Dallas, Tex.

[54] SCHOTTKY BARRIER LIGHT SENSITIVE STORAGE DEVICE FORMED BY RANDOM METAL PARTICLES
6 Claims, 3 Drawing Figs.

[52] U.S. Cl. .......... 250/211 J, 250/213 VT, 313/66, 317/235 N
[51] Int. Cl. .......... H01j 39/12
[50] Field of Search .......... 148/174; 117/212, 200; 29/572; 250/211 V; 313/65 A, 65 AB, 66; 317/235

[56] References Cited

UNITED STATES PATENTS

| | | | |
|---|---|---|---|
| 3,038,952 | 6/1962 | Ralph | 29/572 |
| 3,355,320 | 11/1967 | Spriggs et al. | 117/212 X |
| 3,380,156 | 4/1968 | Lood et al. | 117/212 X |
| 3,427,461 | 2/1969 | Weckler | 250/211 J |
| 3,439,214 | 4/1969 | Kabell | 250/211 J |
| 3,448,349 | 6/1969 | Sumner | 117/212 X |
| 3,458,782 | 7/1969 | Buck et al. | 250/211 J X |
| 3,403,284 | 9/1968 | Buck | 317/235 |

OTHER REFERENCES

E.G. and G., " Photodiode Application Notes," Electronics Products Div. Boston, Mass. November, 1967.
Hunter, " Handbook of Semiconductor Electronics," Mc-Graw-Hill, 2nd Ed., March 1, 1962, p. 5.3.

*Primary Examiner*—James W. Lawrence
*Assistant Examiner*—D. C. Nelms
*Attorneys*—Samuel M. Mims, Jr., James O. Dixon, Andrew M. Hassell, Harold Levine, Melvin Sharp and Richards, Harris & Hubbard

ABSTRACT: An electronic camera utilizing a solid-state light sensitive storage device comprised of a sheet of semiconductor material having a large number of very small electrically isolated metal spots on one surface of the sheet each forming a rectifying, capacitive junction of the type referred to as a Schottky barrier. An electron beam is scanned over a surface upon which the metal spots are formed to reverse bias and capacitively charge the rectifying junctions. A light image focused on the other side of the semiconductor slice discharges each discrete capacitor in proportion to the intensity of the light at the location of said discrete capacitor. The current required to recharge each capacitor as the electron beam is scanned produces an output voltage across a load resistance. The light sensitive storage device is fabricated by properly preparing the surface of the substrate and then evaporatively depositing a layer of the metal, e.g. platinum or gold, at a temperature such that the metal nucleates to form a very thin, discontinuous film having discrete electrically isolated microscopic globules.

PATENTED JAN 1 1 1972 3,634,692

INVENTORS

FRANCOIS A. PADOVANI

GEORGE G. SUMNER

E. Mickey Hubbard

ATTORNEY

SCHOTTKY BARRIER LIGHT SENSITIVE STORAGE DEVICE FORMED BY RANDOM METAL PARTICLES

This invention relates generally to electronic data storage devices, and more particularly relates to a solid-state light sensitive storage device which may be used as the target in a vidicon tube, image storage tube, image converter tube, or the like.

A number of different electronic cameras have been developed for television and related optical image and other data transmission systems. Of these, the vidicon has the inherent advantages of high sensitivity, small size and simple mechanical construction. The vidicon tube utilizes a thin photoconductive layer to convert an optical image to a stored charge pattern which is periodically scanned and erased by an electron beam. The act of erasing the charge pattern with the electron beam creates the video signal.

A Plumbicon device utilizes a lead oxide target for the electron beam and optical image. The lead oxide is disposed in a manner to form a single, large area, graded PN-junction, each layer having a high resistivity. The use of the PN-junction in the Plumbicon results in a distinct difference in overall device performance when compared to the vidicon.

Another type of target for electronic cameras is described in U.S. Pat. No. 3,011,089, entitled "Solid State Light Sensitive Storage Device," issued to F. W. Reynolds on Nov. 28, 1961. This type of target utilizes an array of discrete PN-junctions and has several advantages. The dark current and the light induced current can be essentially independent of the reverse bias voltage on the target, and the response characteristic can have a gamma of unity, as in the Plumbicon. The temperature constant associated with the charge leakage of an array of reverse bias diodes can be very much larger than the intrinsic temperature constant, i.e., the dielectric relaxation temperature, of the bulk material. This indicates, in theory at least, that an infrared responsive camera operating at room temperature is possible. The range of wavelengths to which the device is sensitive is much greater, and includes the visible spectrum, and the sensitivity is more uniform than can be achieved in either of the other two devices. The target performance is insensitive to electron beam bombardment, and the target is not burned by intense light sources. There is no image persistence due to photoconductive lag. The device can be assembled in a tube using standard vacuum techniques, and can be expected to have an operating lifetime substantially in excess of that of either of the other two tubes.

As a result of these potential advantages, a large number of individuals and concerns have exerted considerable efforts, both in this country and abroad, to perfect such a device, but with less than optimum success. Such a target might consist of an array of almost 300,000 diodes on a semiconductor slice on the order of an inch square. The diodes would be formed by diffusion using holes in a silicon dioxide mask only about eight microns in diameter with center-to-center spacing of about 20 microns. To be practical, however, the silicon dioxide mask must then be coated with a metallized film to prevent excess charging of the oxide layer by the electron beam. The metal layer itself must be then divided by very thin separation spaces. The resulting metal film squares serve to bleed off the charge stored in the silicon dioxide layer through the diode under the square. Patterning of the metal film creates severe masking problems in achieving thin lines and registration with the structures previously formed on the semiconductor slice. In addition, the rows and columns of diodes must subsequently be precisely aligned with the deflection yoke of the tube to achieve proper operation.

This invention is concerned with an improved optical image storage device which has substantially all of the advantages of the diode array target, but is much simpler and more economically fabricated, and has substantially greater resolution. The invention utilizes a maskless deposition technique to deposit a discontinuous metal film of very small, electrically isolated, randomly distributed metal particles. The target is comprised of a slice of semiconductor material having a discontinuous metal film comprised of a very large number of very small, electrically isolated, randomly shaped and distributed metal bodies in rectifying contact with the face of the semiconductor slice subjected to the electron beam. Each metal body forms a discrete Schottky barrier which acts as a capacitive storage device. The semiconductor selected depends upon the wavelength to be sensed and may be silicon, germanium or gallium arsenide. Any metal having the necessary barrier height relationship to the chosen semiconductor material may be used, although platinum and gold are particularly suited for use with silicon.

In accordance with another aspect of the invention, the image storage device is fabricated by polishing a surface of the semiconductor material, heating the semiconductor surface to a temperature in the range from about 250° C. to about 350° C., or as high as possible without a deleterious effect, and directing a source of metal atoms at the surface of the semiconductor in a vacuum only for a period sufficient to produce a discontinuous layer of the metal. The metal atoms are preferably derived by evaporation, but sputtering, or other suitable techniques may also be used. The maximum dimension of the discrete, electrically isolated, random geometry nucleated bodies of metal is generally less than about 1 micron and is on the order of from 400–500 A thick.

The novel features believed characteristic of this invention are set forth in the appended claims. The invention itself, however, as well as other objects and advantages thereof, may best be understood by reference to the following detailed description of illustrative embodiments, when read in conjunction with the accompanying drawing, wherein:

Figure 1:
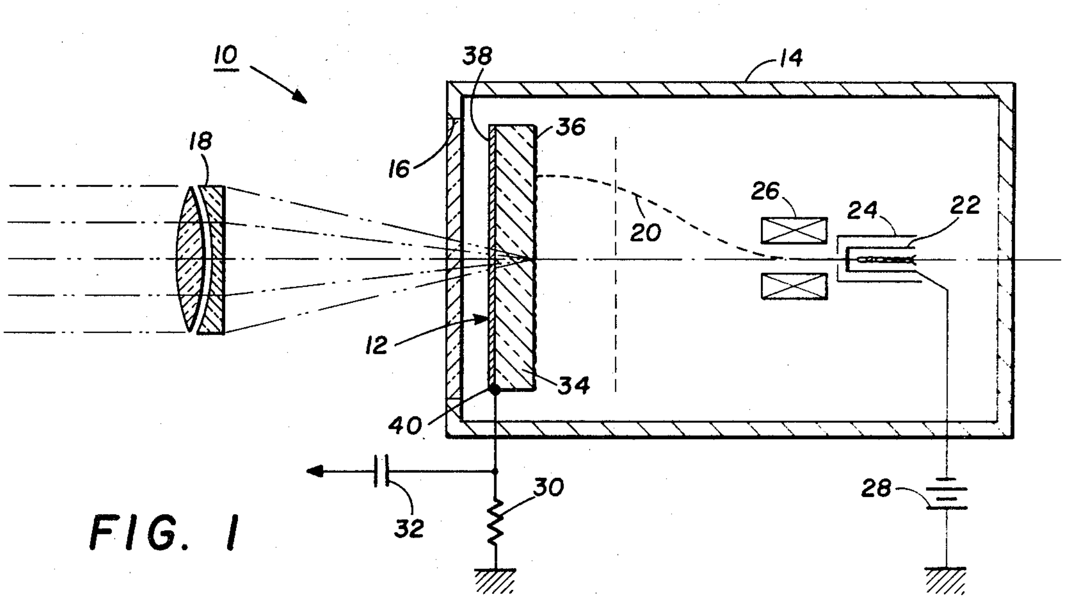
FIG. 1 is a simplified schematic diagram of an electronic camera in accordance with the present invention.

Referring now to the drawing, and in particular to FIG. 1, a video camera in highly simplified form is indicated generally by the reference numeral 10. The video camera 10 is of conventional design except for the optical image storage device 12, commonly referred to as the target. The target 12 is located in an evacuated tube 14. An optical image may be focused on the target 12 through a window 16 by a lens system 18. A low energy electron beam 20 passes from a cathode 22 through an apertured anode 24 and is scanned over the face of the target 12 by a conventional deflection means represented at 26. The cathode 22 is biased by a voltage source 28. Current is produced through a load resistor 30 when the electron beam strikes the target 12 producing a video output signal which is sensed through capacitor 32, as will hereafter be described in greater detail.

Figure 3:
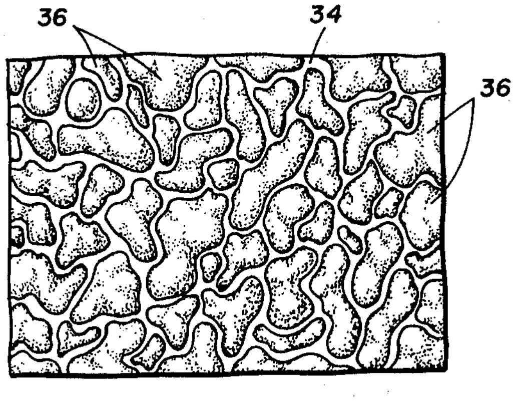
FIG. 3 is a greatly enlarged view of a small portion of one face of the image storage device of FIG. 2.

The target 12 is comprised of a monolithic slice of semiconductor material 34. A very large number of very small electrically isolated metal bodies 36 are in rectifying contact with the face of the semiconductor material that is subjected to the electron beam 20. The metal particles 36 have a random configuration, as illustrated in the enlarged view of a portion of the face on the semiconductor 34 shown in FIG. 3, and have a mean size ranging from about 0.02 to 1.0 micron. There are about $10^8$ to $10^{11}$ discrete particles per square centimeter. Ohmic contact is made to the semiconductor body 34 by suitable conventional means represented at 40. A thin layer of conventional antireflection material 38 may be provided on the other face of the semiconductor 34.

Figure 2:
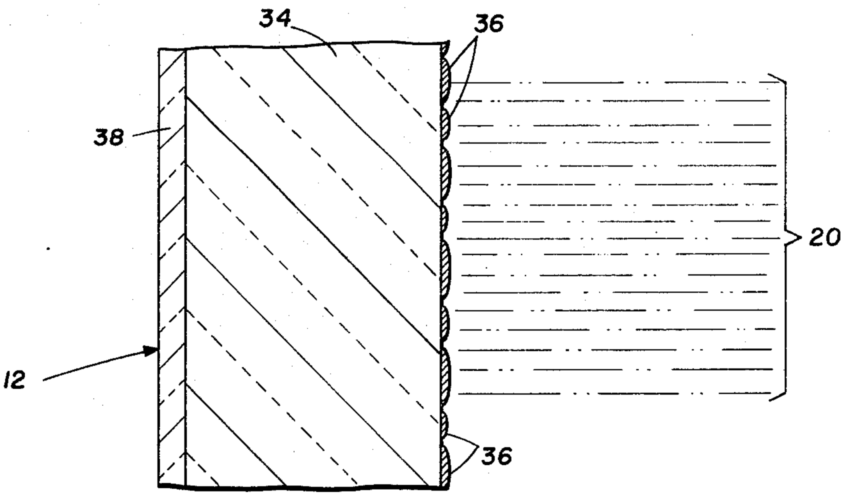
FIG. 2 is an enlarged sectional view of a portion of the image storage device of the camera of FIG. 1.

The target 12 operates in the same basic manner as the diode array described in the above-referenced patent. The target 12 acts as an optical image storage device during each scan cycle of the electron beam 20, which is typically the same as that used in commercial television. The electron beam 20 covers a very large number of the metal particles 36, even substantially more than is illustrated in FIG. 2, at any one time. This has two very important advantages. The large number of discrete diodes provides high redundancy so that the failure of a few of the diodes does not materially affect the operation of the target. In prior diode arrays, a faulty diode results in a white spot in a video image which cannot be remedied. The other important advantage is that resolution is not dependent upon the size of the diodes, but as a practical matter is limited only by the diameter of the beam. The electron beam 20 charges the metal bodies essentially to cathode potential, thus reverse biasing and charging the rectifying junctions formed between each metal particle 36 and the semiconductor slice. The resulting depletion layer then acts as the dielectric in a capacitor with the remainder of the semiconductor acting as one plate and the individual metal particles each acting as another plate. The capacitance of the rectifying junction tends to hold this charge at a high level during the scan period, although the charge is reduced by an amount dependent upon the reverse conductance and capacitance, or RC time constant, of the barrier. The incident light focused upon the semiconductor 34 by the image system 18 creates hole-electron pairs in the semiconductor in proportion to the amount of light incident upon the region of the semiconductor adjacent the junction. The minority carriers migrate to the junction and reduce the stored charge by a proportional amount. Then when the electron beam 20 again passes the metal particles 36 during the next scan cycle, the rectifying junctions are again charged. This produces a current through the load resistor 30 proportional to the amount of light, thus producing the video output voltage through capacitor 32.

The semiconductor 34 is normally selected to provide the most efficient response to the particular portion of the light energy spectrum of interest. Silicon, germanium and gallium arsenide are of particular importance. The impurity concentration of the semiconductor should be selected to provide the longest possible storage time, i.e., the minimum dark current for most applications. The metal used to form the discontinuous layer 36 should be selected to provide the highest possible barrier height when associated with the particular semiconductor material. N-type silicon having an impurity concentration of about $10^{17}$ atoms per cubic centimeter and platinum are a particularly useful combination for television cameras. The group IB metals, gold, silver and copper, may also be used, as well as the other transition metals of group VIII, palladium, iron, cobalt, nickel, ruthenium, rhodium, osmium, and iridium.

The target 12 may be fabricated by first mechanically or chemically polishing the surface. Then the surface is cleaned by thermal sublimation in a vacuum. Then the discontinuous metal film may be deposited using conventional evaporation equipment. During the evaporation deposition of the metal, the formation of a discontinuous film is promoted by maintaining the substrate at a high temperature. However, as the substrate temperature increases, the rate of diffusion of the metal into the semiconductor increases, thus degrading the quality of the Schottky barrier being formed. A temperature on the order of 300° C. has been found to be suitable, with a deposition time on the order of 15 minutes.

Although preferred embodiments of the invention have been described in detail, it is to be understood that various changes, substitutions, and alterations can be made therein without departing from the spirit and scope of the invention as defined by the appended claims.

What is claimed is:

1. A photosensitive storage device comprising a plurality of capacitive elements, one plate of each capacitive element being formed by a semiconductor sheet and the other plate consisting essentially of a discontinuous metal film that defines a plurality of randomly distributed metal particles, each discrete particle of said film forming the other part of one of said plurality of capacitive elements.

2. The photosensitive storage device defined in claim 1 wherein each discrete particle is in rectifying contact with the semiconductor sheet and the dielectric layer of the capacitor is formed by the depletion region in the semiconductor sheet.

3. The photosensitive storage device defined in claim 2 wherein the semiconductor sheet is selected from the group consisting of silicon, germanium and gallium arsenide and the metal is selected from the group consisting of the transition metals of the group VIII and the metals of group IB.

4. The photosensitive storage system comprising a planar array of capacitive elements, one plate of all of the capacitive elements being formed by a common semiconductor sheet and the other plate consisting essentially of a discontinuous metal film that defines a plurality of randomly distributed metal particles, each discrete particle of said film forming the other plate of one of said array of capacitive elements, means for scanning the capacitive elements with an electron beam, and means for directing a light image onto the semiconductor sheet.

5. The photosensitive storage system defined in claim 4 wherein each metal film is in rectifying contact with the semiconductor sheet and the dielectric layer of the capacitor is formed by the depletion region in the semiconductor sheet.

6. The photosensitive storage system defined in claim 5 wherein the semiconductor sheet is selected from the group consisting of silicon, germanium and gallium arsenide.

* * * * *